United States Patent
Anderson et al.

(10) Patent No.: US 7,135,779 B2
(45) Date of Patent: Nov. 14, 2006

(54) METHOD FOR PACKAGING INTEGRATED CIRCUIT CHIPS

(75) Inventors: James Anderson, Huntington Beach, CA (US); Gershon Akerling, Culver City, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 286 days.

(21) Appl. No.: 10/823,877

(22) Filed: Apr. 14, 2004

(65) Prior Publication Data

US 2004/0248342 A1  Dec. 9, 2004

Related U.S. Application Data

(62) Division of application No. 10/454,081, filed on Jun. 4, 2003, now Pat. No. 6,768,189.

(51) Int. Cl.
*H01L 23/48* (2006.01)
(52) U.S. Cl. ............... 257/778; 257/774; 257/E23.011
(58) Field of Classification Search ............... 257/620, 257/774, 778; 438/667, 462, 458, 113
See application file for complete search history.

(56) References Cited

U.S. PATENT DOCUMENTS

| | | | |
|---|---|---|---|
| 5,436,412 A | 7/1995 | Ahmad et al. | |
| 5,579,207 A | 11/1996 | Hayden et al. | |
| 5,741,729 A | 4/1998 | Selna | |
| 5,945,734 A * | 8/1999 | McKay | 257/687 |
| 5,987,732 A | 11/1999 | Lee et al. | |
| 6,097,265 A | 8/2000 | Chan et al. | |
| 6,137,164 A | 10/2000 | Yew et al. | |
| 6,194,669 B1 | 2/2001 | Bjorndahl et al. | |
| 6,223,439 B1 | 5/2001 | Wonderley | |
| 6,459,039 B1 | 10/2002 | Bezama et al. | |
| 6,521,845 B1 | 2/2003 | Barrow | |
| 6,632,372 B1 | 10/2003 | Chen et al. | |
| 6,693,361 B1 * | 2/2004 | Siniaguine et al. | 257/777 |
| 2001/0005043 A1 | 6/2001 | Yamada | |
| 2003/0080398 A1 | 5/2003 | Badehi | |

FOREIGN PATENT DOCUMENTS

EP  1 085 569 A  3/2001

* cited by examiner

*Primary Examiner*—Roy Potter
(74) *Attorney, Agent, or Firm*—John A. Miller; Warner, Hoffmann, Miller & LaLone, P.C.

(57) ABSTRACT

A method for packaging integrated circuits in a wafer format that eliminates wire bonds. A wafer substrate on which the integrated circuits have been fabricated is patterned and etched to form signal and ground via through the substrate. A back-side ground plane is deposited in contact with the ground vias. A protective layer is formed on the top surface of the substrate, and a protective layer is formed on the bottom surface of the substrate, where the bottom protective layer fills in removed substrate material between the integrated circuits. Vias are formed through the bottom protective layer, and the wafer substrate is diced between the integrated circuits.

23 Claims, 4 Drawing Sheets

METHOD FOR PACKAGING INTEGRATED CIRCUIT CHIPS

CROSS-REFERENCE TO RELATED APPLICATIONS

This application is a divisional application of U.S. patent application Ser. No. 10/454,081, filed Jun. 4, 2003, now U.S. Pat. No. 6,768,189 titled "High Power Chip Scale Package".

BACKGROUND OF THE INVENTION

1. Field of the Invention

This invention relates generally to a process for packaging integrated circuits and, more particularly, to a process for packaging integrated circuit chips that eliminates lead frame structures and wire bonds, and allows testing while the integrated circuit is still in a wafer format.

2. Discussion of the Related Art

As is well understood in the art, many integrated circuit chips are patterned and formed together on an integrated circuit wafer. The wafer may be 3–15 inches in diameter, and include hundreds or thousands of integrated circuit chips symmetrically disposed in a matrix configuration on the wafer depending on the circuit complexity. Once the integrated circuit chips are fabricated, the wafer is cut between the integrated circuit chips to separate the chips from the wafer. The chips are then tested for performance.

Once the integrated circuit chip is separated from the wafer, it is sometimes packaged in a packaging assembly that provides environmental protection and the like. Generally, the integrated circuit chip is mounted to a metallized ground plane to provide a ground reference and thermal coupling to remove heat from the integrated circuit chip. A lead frame is mounted to the assembly to provide power, signal and ground connections to other circuit elements outside of the package. Wire bonds are used to provide electrical connections between the lead frame and the chip, and between the lead frame and the ground plane. However, the wire bonds cause parasitic inductances and capacitances that compromise performance of the integrated circuit, especially at high frequencies.

FIG. 1 is a cross-sectional view of a packaging assembly 10 for packaging an integrated circuit chip 12 of the type discussed above. The integrated circuit chip 12 is mounted to a back-side ground plane 14 by a thermally and electrically conductive attachment layer 16, such as solder. The ground plane 14 is mounted to a die paddle 18 associated with a lead frame 20. The lead frame 20 includes a plurality of separate leads 24 that are electrically isolated from each other and from the die paddle 18. The leads 24 provide signal and power connections to the integrated circuit chip 12 from other circuit elements and systems. Metal traces 26 are deposited on top of the leads 24 within the packaging assembly 10 to provide a good electrical contact thereto. Signal wire bonds 28 are electrically connected to the traces 26 and to the chip 12 to make electrical connections thereto. Additionally, ground wire bonds 30 are electrically coupled to the ground plane 14 and the traces 26, or the ground plane 14 and the chip 12, as shown. A flowable solder layer 32 is deposited on the bottom surface of the leads 24 and the die paddle 18 to provide good electrical, mechanical and thermal coupling.

A moldable material, such as a plastic compound, is injection molded around the integrated circuit chip 12, the wire bonds 28 and 30 and the lead frame 20 to seal the components and provide a protective cover 36. The packaging assembly 10 is surface mounted to a circuit board (not shown) including other packaging assemblies to form an electrical system. The solder layer 32 is heated so that solder flows up the sides of the leads 24 to make good electrical connection to the circuit board.

The leads 24 of the lead frame 20 of the packaging assembly 10 shown in FIG. 1 extend beyond the sides of the protective cover 36. Thus, the size of the assembly 10 is larger than it needs to be. FIG. 2 is a cross-sectional view of another known packaging assembly 40 that is a variation of the packaging assembly 10 where like elements are identified by the same reference numeral. In this embodiment, the molding forming the cover 36 has been molded to form straight sides with the leads 24 so that when the solder flows up the side of the leads 24, it still makes electrical contact thereto.

SUMMARY OF THE INVENTION

In accordance with the teachings of the present invention, a process for packaging integrated circuits is disclosed that eliminates the wire bonds required in the prior art, and provides integrated circuit packaging while the circuit is still in a wafer format. The wafer substrate on which the several integrated circuits have been fabricated is patterned and etched to form signal and power vias through the substrate around an outside periphery of each circuit, and to form ground vias through the substrate beneath the circuits. The combination of a portion of the wafer substrate, the vias and the integrated circuit define an integrated circuit die. Bonding pads are deposited on a top surface and a bottom surface of the wafer substrate that are electrically coupled to the signal vias. A back-side ground plane is provided in electrical contact with the ground vias.

A top protective layer is deposited over all of the integrated circuits, and a photoresist is deposited, patterned and etched on the bottom surface of the wafer substrate so that wafer substrate material can be removed between the dies. A bottom protective layer is then deposited on a bottom surface of the wafer substrate so that it fills the areas between the dies where the substrate material has been removed. The bottom protective layer is then patterned and etched to provide electrical vias therethrough in contact with the back-side metal layer and the signal pads to make electrical contact thereto outside of the packaging assembly. The wafer is then diced along edges of the dies so that the various vias on the sides of the dies are exposed to provide electrical signals to the circuit within the assembly.

Additional advantages and features of the present invention will become apparent from the following description and appended claims, taken in conjunction with the accompanying drawings.

DETAILED DESCRIPTION OF THE EMBODIMENTS

Figure 1:
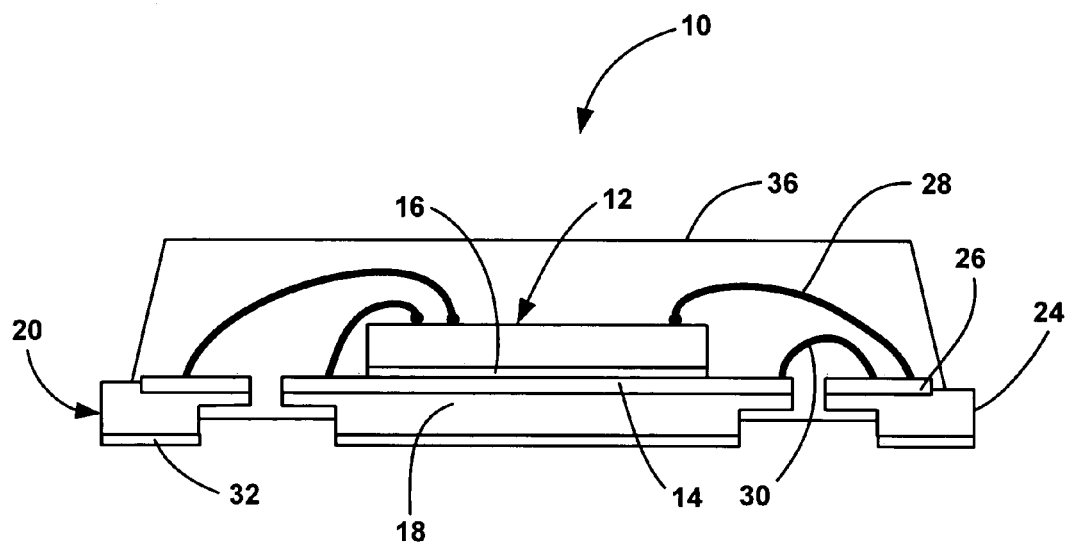
FIG. 1 is a cross-sectional view of a known packaging assembly for an integrated circuit.
Figure 2:
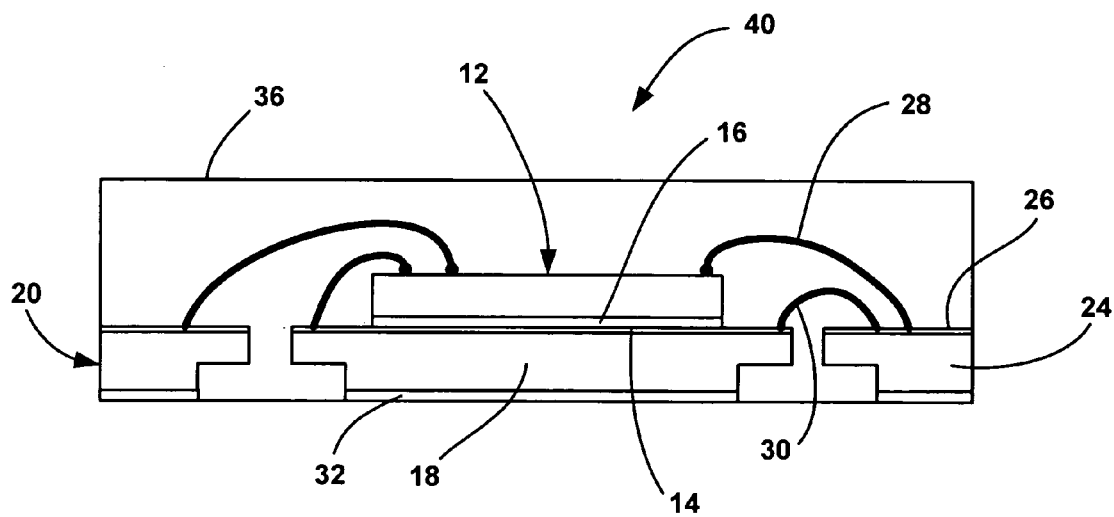
FIG. 2 is a cross-sectional view of another known packaging assembly for an integrated circuit.
Figure 3:
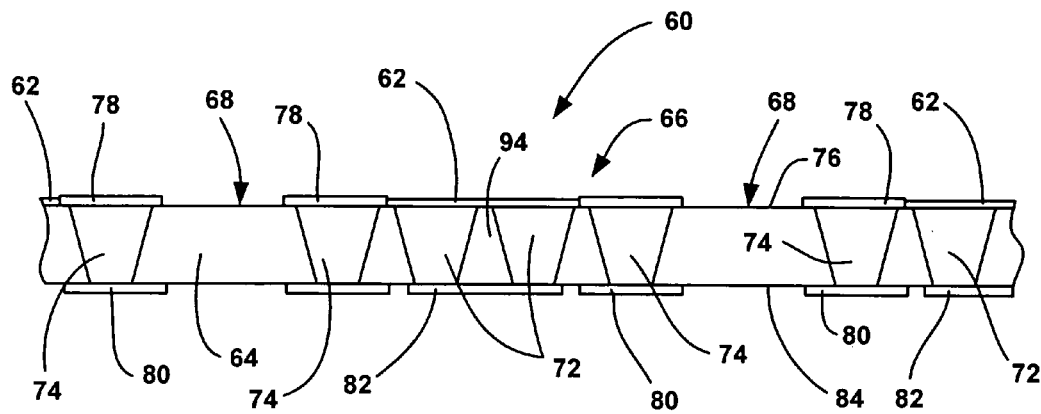
FIGS. 3–6 are cross-sectional views of a structural configuration showing a fabrication technique for packaging integrated circuits in a wafer format, according to the invention.

The following discussion of the embodiments of the invention directed to a process for packaging integrated circuits in a wafer format is merely exemplary in nature, and is in no way intended to limit the invention or its application or uses.

FIGS. 3–6 are cross-sectional views of an integrated circuit structure 60 that depicts processing steps for packaging integrated circuits 62, while the integrated circuits 62 are still part of the fabrication wafer, represented here as a semiconductor wafer substrate 64. The semiconductor substrate 64 can be any suitable semiconductor or substrate wafer material depending on the particular device, such as Si, InP, GaAs, etc., and will have the appropriate thickness, such as 50–1000 μm. Further, the wafer can be any suitable diameter, and the integrated circuits 62 can be any suitable electrical component, such as an amplifier, RAM, DAC, ADC, etc. The integrated circuits 62 are part of an integrated circuit die 66, where the many dies are separated by scribe lanes 68. Typical integrated circuit die sizes range from ½mm² to 625 mm².

As will be discussed in more detail herein, electrical connections, including signal connections, power connections and ground connections, are made to other circuits outside of the packaging assembly by ground vias 72 and signal and power vias 74. The vias 72 and 74 are formed through the substrate 64 by patterning a photoresist layer (not shown) on the substrate 64, etching away the semiconductor material through the patterned photoresist layer where the via is to be located, and filling the formed hole in the substrate 64 with a suitable via metal, such as a copper alloy. As shown, the vias 72 and 74 are formed through a top surface 76 of the substrate 64 by any of several techniques known in the art including anisotropic etching.

A series of top-side bond pads 78 are patterned around the integrated circuits 62, and provide signal and power connections to the integrated circuits 62. Particularly, the various signal and power traces associated with the integrated circuits 62 are formed along an edge of the integrated circuits 62 so that the bond pads 78 can make electrical contact thereto. The bond pads 78 are electrically coupled to back-side bond pads 80 on a back-side 84 of the substrate 64 by the appropriate via 74, as shown. A back-side ground plane 82 is patterned on the back-side 84 of the substrate 64, and connections to the ground plane 82 from the integrated circuits 62 are made through the appropriate vias 72. The ground plane 82 has a suitable size and configuration to provide the appropriate thermal conductivity for heat sink purposes. As is apparent, the ground plane 82 is electrically isolated from the back-side pads 80. Thus, the die 66 is made up of the integrated circuit 62, the pads 78 and 80, a portion of the substrate 64 and the ground plane 82.

Figure 4:
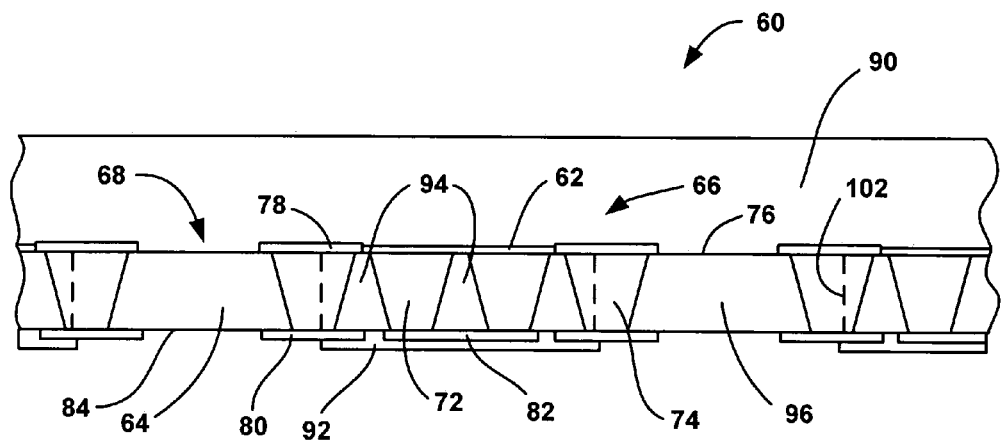

A suitable material is then deposited on top of the entire wafer to provide a top protective layer 90, as shown in FIG. 4. The protective layer 90 can be any suitable material, such as a plastic compound, and can be any suitable thickness, such as 150–200 μm. A photoresist layer 92 is deposited and patterned on a back-side of the structure 60 so that regions 96 of the substrate 64 in the scribe lanes 68 are exposed and regions 94 of the substrate 64 between the vias 72 and 74 within the die 66 are unexposed. A suitable etchant is then used to remove the substrate material in the regions 96 so that the original material that held the dies 66 together is removed. The various dies 66 in the wafer are still held together by the top protective layer 90. During the substrate etch, the etchant will move laterally inwards in the dies 66 between the signal vias 74 around its outer edge to a location represented by line 102.

Figure 5:
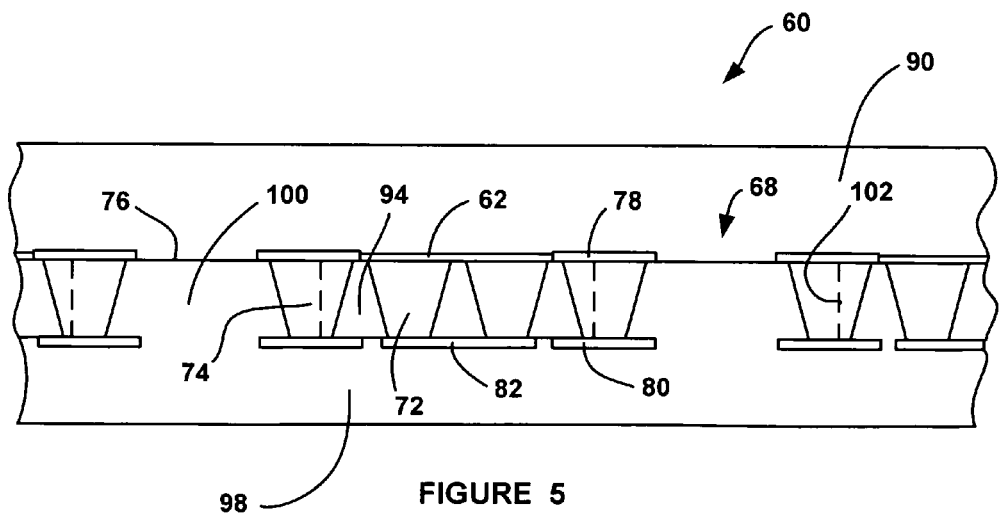

The photoresist layer 92 is then removed by a suitable etching process, and a bottom protective layer 98 is deposited on the back-side of the structure 60 so that it fills in regions 100 where the regions 96 of the substrate 64 have previously been removed, as shown in FIG. 5. Thus, the top layer 90 and the bottom layer 98 merge in the scribe lanes 68, as shown. The protective layer 98 can be made of the same material as the protective layer 90, or another suitable material. Also, in one embodiment, the protective layer 98 has a thickness about the same as the protective layer 90, such as 150–200 μm.

Figure 6:
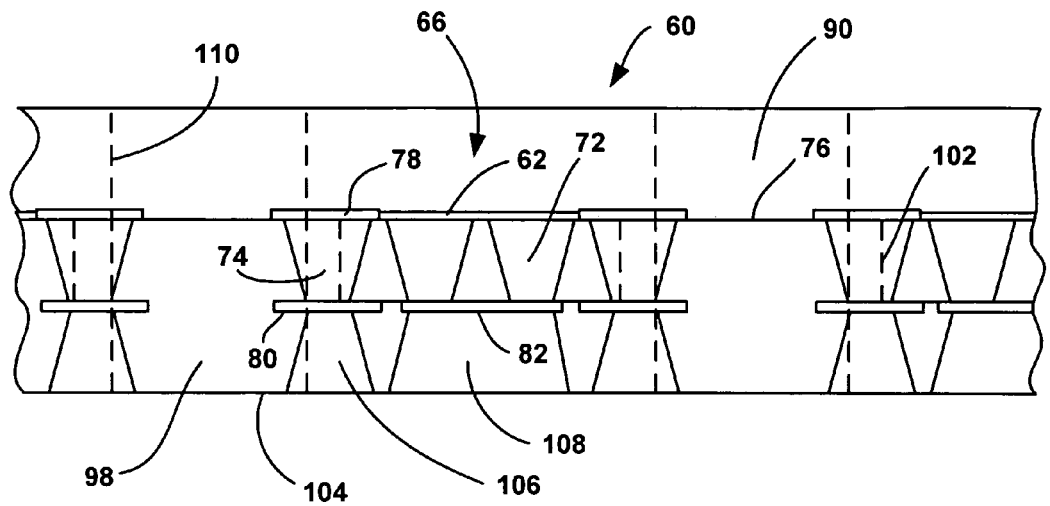

Next, a photoresist layer is deposited and patterned on a back-side surface 104 of the back protective layer 98. Openings in the photoresist layer are defined opposite to the bond pads 80 and the ground planes 82. The protective layer 98 is then etched through the openings in the photoresist layer so that openings in the protective layer 98 are provided to expose the pads 80 and the back-side ground plane 82, as shown in FIG. 6. The holes are filled with a via material to provide electrical signal and power vias 106 that contact the pads 80 and ground vias 108 that contact the ground planes 82. Therefore, the dies 66 are completely protected by the protective layers 90 and 98, and have electrical coupling to the integrated circuits 62 through the protective layer 98 by the vias 106 and 108.

While the dies 66 are still in the wafer format, they can be probed, tested and mapped. Once the dies 66 are tested, they are separated by cutting the structure 60 along lines 110 to separate the dies 66 into protected integrated circuit packaged assemblies. As is apparent, the signal and power vias 74 will be exposed to the outside environment of the packaged assembly, and the ground planes 82 are in electrical contact by the vias 108 at a bottom of the packaging assembly. Further, the die semiconductor material is protected by the protective layer 98.

Figure 7:
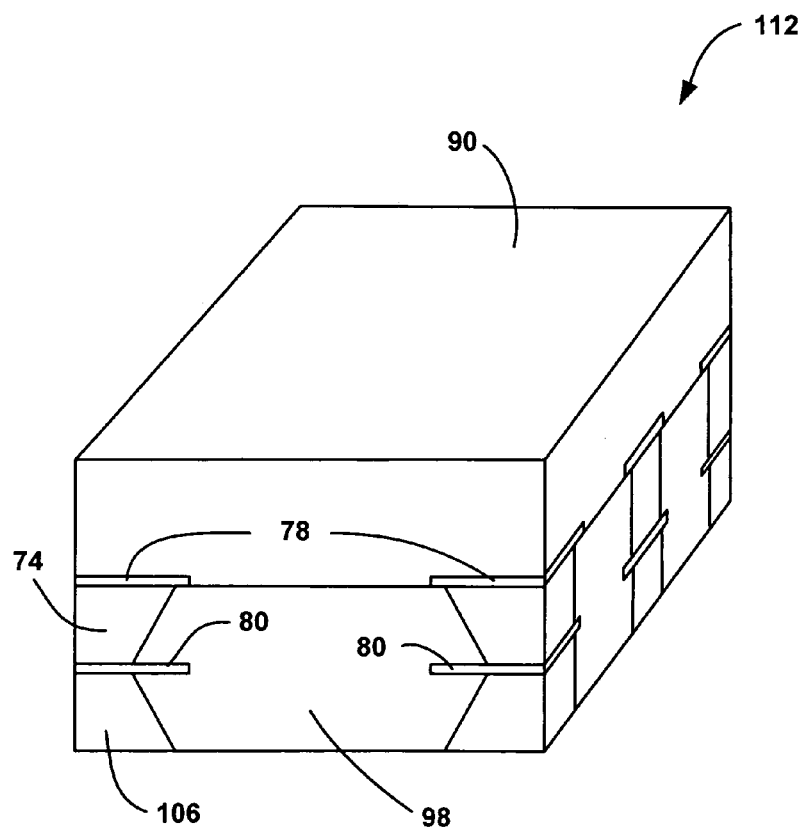
FIG. 7 is a perspective view of one of the integrated circuit packages shown in FIG. 6 separated from the wafer.

FIG. 7 is a perspective view of a packaged die 112 that is one of the separated dies 66 removed from the structure 60 along the cut lines 110, where like elements are represented by like reference numerals. As is apparent, electrical contact to the integrated circuit 62 can be provided by the various vias 106 and 74. The packaged die 112 can be surface mounted to an electrical circuit board, where solder is caused to flow up the sides of the vias 106 to make electrical contact as was done in the known packaging assemblies. In one embodiment, the complete thickness of the packaged die 112 can be as low as about 100–500 μm. This is substantially thinner than those packaging assemblies known in the art for the same size die.

Figure 8:
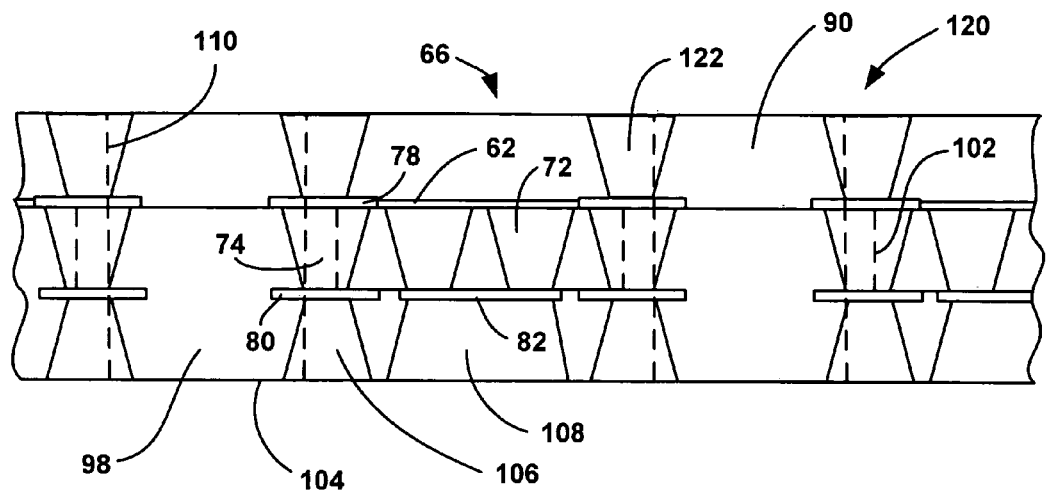
FIG. 8 is a cross-sectional view of a structural configuration showing a fabrication technique for packaging integrated circuits in a wafer format, according to another embodiment of the present invention.

The packaging fabrication technique discussed above can be extended to a packaging assembly where the dies 66 are stacked. FIG. 8 is a cross-sectional view of a wafer structure 120 depicting this embodiment, where like elements are identified with the same reference numerals used above. In order to provide electrical connections to the integrated circuits 62 from the top, the protective layer 90 is patterned and etched using a photoresist and etchant to form holes through the layer 90 to expose the signal pads 78 below. The openings are then filled with a via material to form vias 122 that make electrical contact with the signal pads 78. A top surface of the vias 122 provide packaged pin connection locations, and can also be used to test the integrated circuits 62 while they are still in the wafer format. The structure 120 is then diced along the cut lines 110, as discussed above, to provide separate packaged dies. In this embodiment, the packaged dies can be surface mounted either right side up or up-side down, and still provide the electrical connections and ground connections to the integrated circuit 62.

Figure 9:
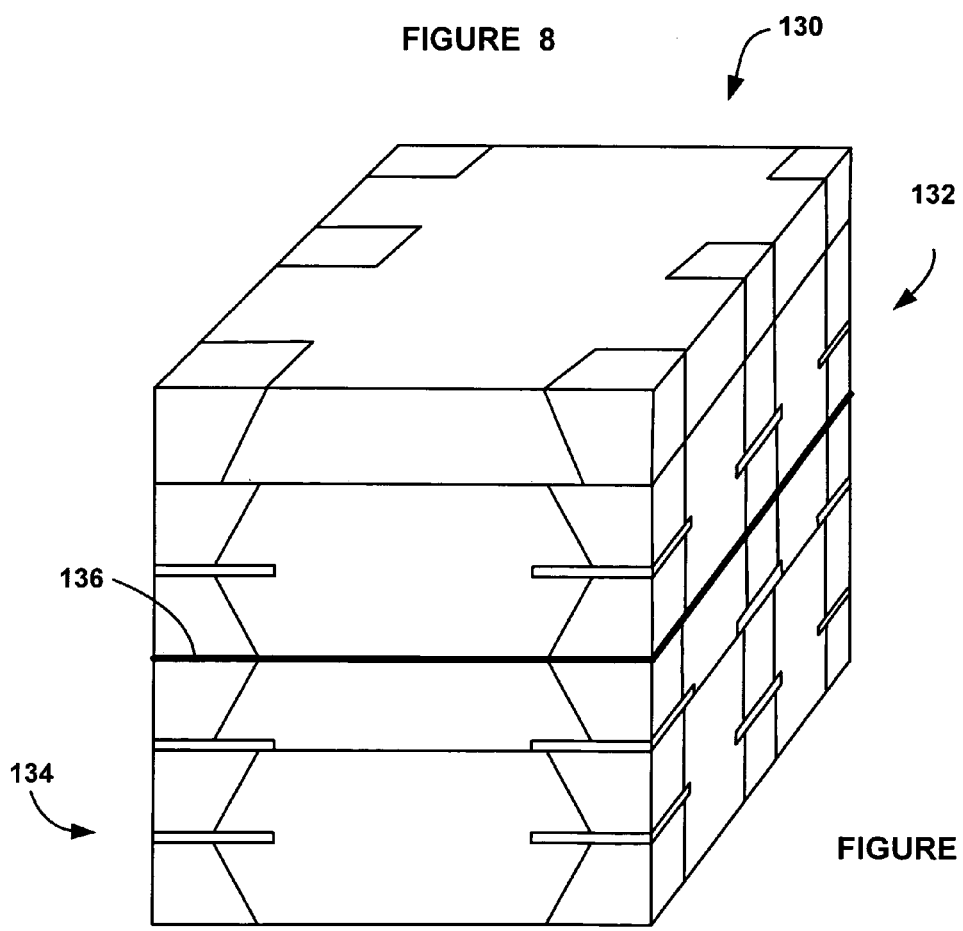
FIG. 9 is a perspective view of two of the circuit packages shown in FIG. 8 separated from the wafer and stacked together.

The vias 122 allow the packaged dies to be stacked on top of each other to further conserve space. FIG. 9 is a perspective view of a packaging assembly 130 that includes a top packaged die 132 mounted to a bottom packaged die 134 by a solder reflow bond 136. As is apparent, both of the packaged dies 132 and 134 are packaged dies stacked from the structure 120 on top of each other. As is apparent, the proper electrical connections are made through the packaging assembly 130 to provide electrical connections to the integrated circuits 62. The invention is not limited to two stacked packaged dies, but can be extended to any reasonable number of stacked dies.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for fabricating packaged integrated circuit dies in a wafer format, said method comprising:
   providing a wafer substrate, said wafer substrate having a top surface and a bottom surface;
   fabricating a plurality of integrated circuits on the top surface of the wafer substrate, each of the integrated circuits being separated from each other by scribe lanes;
   forming signal vias through the substrate relative to the integrated circuits;
   depositing top-side bond pads on the top surface of the substrate in contact with the signal vias, said top-side pads being in electrical contact with an integrated circuit;
   depositing back-side bond pads on the bottom surface of the substrate in contact with the signal vias to make an electrical connection between the top-side pads and the back-side pads;
   depositing a top-side protective layer on the wafer substrate to cover the top-side pads and the integrated circuits;
   removing portions of the substrate material in the scribe lanes from the bottom of the substrate between the integrated circuits;
   depositing a back-side protective layer on the wafer substrate so that the back-side layer fills the removed portions of the substrate in the scribe lanes and contacts the top-side protective layer;
   forming signal vias through the back-side layer to be in electrical contact with the back-side bond pads; and
   cutting the wafer substrate in the scribe lanes to separate the wafer into the packaged dies so that an outer surface of the packaged dies includes exposed signal vias to make electrical connections thereto.

2. The method according to claim 1 further comprising forming a plurality of ground vias extending through the substrate in electrical contact with a back metal layer of the integrated circuits.

3. The method according to claim 2 further comprising depositing a ground plane on the bottom surface of the substrate adjacent to the back-side pads in electrical contact with the ground vias.

4. The method according to claim 3 further comprising forming ground vias through the back-side layer in electrical contact with the ground plane.

5. The method according to claim 1 wherein removing portions of the substrate material includes removing portions of the substrate material between signal vias outside of the scribe lanes.

6. The method according to claim 1 wherein removing portions of the substrate material includes preventing substrate material of the wafer substrate beneath the integrated circuits from being removed.

7. The method according to claim 1 further comprising testing the integrated circuits for performance prior to cutting the wafer.

8. The method according to claim 1 further comprising forming vias through the top-side protective layer that are in electrical contact with the top-side pads.

9. The method according to claim 8 further comprising stacking a plurality of the packaged dies where the vias through the back-side layer in one die are in electrical contact with the vias through the top-side layer in another die.

10. The method according to claim 1 wherein the top-side layer and the back-side protective layer include plastic layers.

11. A method for fabricating a packaged integrated circuit die, said method comprising:
    providing a wafer substrate, said wafer substrate having a first surface and a second surface;
    fabricating integrated circuits on the first surface of the wafer substrate, each of the integrated circuits being separated from each other by scribe lanes;
    forming signal vias through the substrate, said signal vias being electrically coupled to the integrated circuits;
    enclosing the integrated circuits in a protective layer;
    forming signal vias through the protective layer that are electrically coupled to the signal vias formed through the substrate;
    cutting the wafer substrate in the scribe lanes to separate the wafer into packaged dies where the signal vias in the substrate and the protective layer are exposed; and
    forming ground vias extending through the substrate in electrical contact with a back metal of an integrated circuit.

12. The method according to claim 11 wherein enclosing the integrated circuits in a protective layer includes forming a first protective layer in contact with the first surface of the wafer substrate and forming a second protective layer in contact with the second surface of the wafer substrate, wherein the first protective layer and the second protective layer are in contact with each other in the scribe lanes.

13. The method according to claim 11 further comprising etching the wafer substrate to remove wafer substrate material in the scribe lanes.

14. The method according to claim 11 further comprising depositing a plurality of first side bond pads on the first surface of the substrate in electrical contact with the signal vias in the substrate and in electrical contact with an integrated circuit, and depositing a plurality of second side bond pads on the second surface of the substrate in electrical contact with the signal vias in the protective layer.

15. The method according to claim 11 further comprising depositing a ground plane on the second surface of the substrate in electrical contact with the ground vias in the substrate.

16. The method according to claim 11 further comprising forming ground vias through the protective layer in electrical contact with the ground plane.

17. The method according to claim 11 further comprising testing the integrated circuit chips for performance prior to cutting the wafer substrate.

18. A method for fabricating packaged integrated circuit dies in a wafer format, said method comprising:
providing a wafer substrate, said wafer substrate having a top surface and a bottom surface;
fabricating a plurality of integrated circuits on the top surface of the wafer substrate, said integrated circuits being separated from each other by scribe lanes;
forming signal vias through the substrate relative to the integrated circuits;
depositing top-side bond pads on the top surface of the substrate in electrical contact with the signal vias, said top-side pads being in electrical contact with an integrated circuit;
depositing back-side bond pads on the bottom surface of the substrate in electrical contact with the signal vias to make an electrical connection between the top-side pads and the back-side pads;
forming a plurality of ground vias extending through the substrate in electrical contact with a back metal layer of the integrated circuits;
depositing a ground plane on the bottom surface of the substrate adjacent to the back-side pad in electrical contact with the ground vias;
forming ground vias through the back-side layer in electrical contact with the ground plane;
depositing a top-side protective layer on the wafer substrate to cover the top-side pads and the integrated circuits;
removing portions of the substrate material in the scribe lanes, wherein removing portions of the substrate material includes removing portions of the substrate material between signal vias outside of the scribe lanes and preventing substrate material of the wafer substrate beneath the integrated circuits from being removed from the bottom of the substrate between the integrated circuits;
depositing a back-side protective layer on the wafer substrate so that the back-side layer fills the removed portions of the substrate in the scribe lanes and contacts the top-side protective layer;
forming signal vias through the back-side layer to be in electrical contact with the back-side bond pads; and
cutting the wafer substrate in the scribe lanes to separate the wafer into the packaged dies so that an outer surface of the packaged dies includes exposed signal vias to make electrical connections thereto.

19. The method according to claim 18 further comprising forming vias through the top-side protective layer that are in electrical contact with the top-side pads, and stacking a plurality of the packaged dies where the vias to the back-side layer in one die are in electrical contact with the vias through the top-side layer in another die.

20. A method for fabricating a packaged integrated circuit die, said method comprising:
providing a wafer substrate, said wafer substrate having a first surface and a second surface;
fabricating integrated circuits on the first surface of the wafer substrate, each of the integrated circuits being separated from each other by scribe lanes;
forming signal vias through the substrate, said signal vias being electrically coupled to the integrated circuits;
enclosing the integrated circuits in a protective layer including forming a first protective layer in contact with the first surface of the wafer substrate and forming a second protective layer in contact with a second surface of the wafer substrate, wherein the first protective layer and the second protective layer are in contact with each other in the scribe lanes;
forming signal vias through the protective layer that are electrically coupled to the signal vias formed through the substrate; and
cutting the wafer substrate in the scribe lanes to separate the wafer into packaged dies where the signal vias in the substrate and the protective layer are exposed.

21. A method for fabricating a packaged integrated circuit die, said method comprising:
providing a wafer substrate, said wafer substrate having a first surface and a second surface;
fabricating integrated circuits on the first surface of the wafer substrate, each of the integrated circuits being separated from each other by scribe lanes;
forming signal vias through the substrate, said signal vias being electrically coupled to the integrated circuits;
enclosing the integrated circuits in a protective layer;
forming signal vias through the protective layer that are electrically coupled to the signal vias formed through the substrate;
cutting the wafer substrate in the scribe lanes to separate the wafer into packaged dies where the signal vias in the substrate and the protective layer are exposed; and
etching the wafer substrate to remove wafer substrate material in the scribe lanes.

22. A method for fabricating a packaged integrated circuit die, said method comprising:
providing a wafer substrate, said wafer substrate having a first surface and a second surface;
fabricating integrated circuits on the first surface of the wafer substrate, each of the integrated circuits being separated from each other by scribe lanes;
forming signal vias through the substrate, said signal vias being electrically coupled to the integrated circuits;
enclosing the integrated circuits in a protective layer;
forming signal vias through the protective layer that are electrically coupled to the signal vias formed through the substrate;
cutting the wafer substrate in the scribe lanes to separate the wafer into packaged dies where the signal vias in the substrate and the protective layer are exposed; and
depositing a plurality of first side bond pads on the first surface of the substrate in electrical contact with the signal vias in the substrate and in electrical contact with an integrated circuit, and depositing a plurality of second side bond pads on the second surface of the substrate in electrical contact with the signal vias in the protective layer.

23. A method for fabricating a packaged integrated circuit die, said method comprising:
  providing a wafer substrate, said wafer substrate having a first surface and a second surface;
  fabricating integrated circuits on the first surface of the wafer substrate, each of the integrated circuits being separated from each other by scribe lanes;
  forming signal vias through the substrate, said signal vias being electrically coupled to the integrated circuits;
  enclosing the integrated circuits in a protective layer;
  forming signal vias through the protective layer that are electrically coupled to the signal vias formed through the substrate;
  cutting the wafer substrate in the scribe lanes to separate the wafer into packaged dies where the signal vias in the substrate and the protective layer are exposed; and
  testing the integrated circuit chips for performance prior to cutting the wafer substrate.

* * * * *